US012684706B2

(12) United States Patent
Brandt et al.

(10) Patent No.: US 12,684,706 B2
(45) Date of Patent: *Jul. 14, 2026

(54) ELECTRONIC ASSEMBLY WITH A COMPRESSIVE ELECTRICAL CONNECTION BETWEEN A CIRCUIT BOARD AND HOUSING

(71) Applicant: Deere & Company, Moline, IL (US)

(72) Inventors: Patrick R Brandt, West Fargo, ND (US); Thomas J. Roan, Fargo, ND (US); Stephen P. Lind, Fargo, ND (US); Shane K. Erickson, Glyndon, MN (US); Roger K. Amundson, West Fargo, ND (US)

(73) Assignee: Deere & Company, Moline, IL (US)

( * ) Notice: Subject to any disclaimer, the term of this patent is extended or adjusted under 35 U.S.C. 154(b) by 361 days.

This patent is subject to a terminal disclaimer.

(21) Appl. No.: 18/472,716

(22) Filed: Sep. 22, 2023

(65) Prior Publication Data

US 2024/0431040 A1      Dec. 26, 2024

Related U.S. Application Data

(60) Provisional application No. 63/510,256, filed on Jun. 26, 2023.

(51) Int. Cl.
| | |
|---|---|
| *H05K 5/00* | (2025.01) |
| *H01R 12/70* | (2011.01) |
| *H05K 7/14* | (2006.01) |

(52) U.S. Cl.
CPC ....... *H05K 5/0052* (2013.01); *H01R 12/7023* (2013.01); *H05K 7/14322* (2022.08)

(58) Field of Classification Search
CPC .. H05K 5/0052; H05K 5/0047; H05K 5/0056; H05K 5/006; H04M 1/0252; H02K 11/33; H01R 12/7023; H01R 12/7017
See application file for complete search history.

(56) References Cited

U.S. PATENT DOCUMENTS

| | | | |
|---|---|---|---|
| 4,500,943 A | 2/1985 | Greene | |
| 6,538,196 B1 * | 3/2003 | MacDonald | H05K 7/1417 |
| | | | 174/363 |
| 7,297,034 B1 * | 11/2007 | Wieland | H01R 4/64 |
| | | | 439/83 |
| 8,148,633 B2 * | 4/2012 | Hung | G06F 1/1626 |
| | | | 174/559 |
| 9,900,999 B1 | 2/2018 | Lim et al. | |
| 10,278,305 B2 * | 4/2019 | Roan | H05K 7/20936 |
| 11,839,043 B2 * | 12/2023 | Hadwan | H05K 5/061 |

(Continued)

*Primary Examiner* — James Wu
(74) *Attorney, Agent, or Firm* — Hanley, Flight and Zimmerman, LLC

(57) ABSTRACT

An electronic assembly includes a first housing portion having one or more recesses along at least a portion of a perimeter of the first housing portion. A second housing portion has one or more arms extending from a body of the second housing portion to engage the recesses in a snap-fit connection. A cavity is formed between the first housing portion and the second portion. A circuit board resides in the cavity. The circuit board has a conductive trace that faces the first housing portion at a metallic conductive region. The snap-fit connection forms an electrical and mechanical connection between the conductive trace and the metallic conductive region.

15 Claims, 11 Drawing Sheets

(56)         References Cited

U.S. PATENT DOCUMENTS

| | | |
|---|---|---|
| 2009/0103267 A1 | 4/2009 | Wieland et al. |
| 2016/0366771 A1 | 12/2016 | Schmit |
| 2022/0304170 A1 | 9/2022 | Schmaltz et al. |
| 2024/0429647 A1* | 12/2024 | Brandt ............... H01R 13/5202 |

* cited by examiner

ELECTRONIC ASSEMBLY WITH A COMPRESSIVE ELECTRICAL CONNECTION BETWEEN A CIRCUIT BOARD AND HOUSING

RELATED APPLICATIONS

This application claims priority to U.S. provisional application No. 63/510,256, filed Jun. 26, 2023, where the above application is hereby incorporated by reference herein.

FIELD

This disclosure relates to an electronic assembly with a compressive electrical connection between a circuit board and a housing.

BACKGROUND

In some prior art electronic enclosures, a reliable electrical connection is required between a circuit board and housing. In one example, a conductive fastener, like a bolt or screw, forms a mechanical and electrical connection between an annular metallic pad around a hole (e.g., metal plated through-hole) in the circuit board and a metallic housing portion. However, variations in manufacturing tolerances can make the circuit board vulnerable to mechanical stress and cracking around the conductive fastener. In another example a conductive spring forms a mechanical and electrical connection between a metallic paid on the circuit board and metallic housing portion. However, the conductive springs are prone to placement variations. Accordingly, there is need for an electronic assembly with a compressive electrical connection between a circuit board and a housing.

SUMMARY

In accordance with one embodiment, an electronic assembly comprises a first housing portion having one or more recesses along at least a portion of a perimeter of the first housing portion. A second housing portion has one or more arms extending from a body of the second housing portion to engage the recesses in a snap-fit connection or clip connection. A cavity is formed between the first housing portion and the second portion. A circuit board resides in the cavity; the circuit board has a conductive trace that faces the first housing portion at a metallic conductive region, wherein the snap-fit connection or clip connection forms an electrical and mechanical connection between the conductive trace and the metallic conductive region of the first housing portion.

BRIEF DESCRIPTION OF THE DRAWINGS

Like reference numbers in any set of two or more drawings indicates like elements, features or steps.

DETAILED DESCRIPTION

Figure 1:
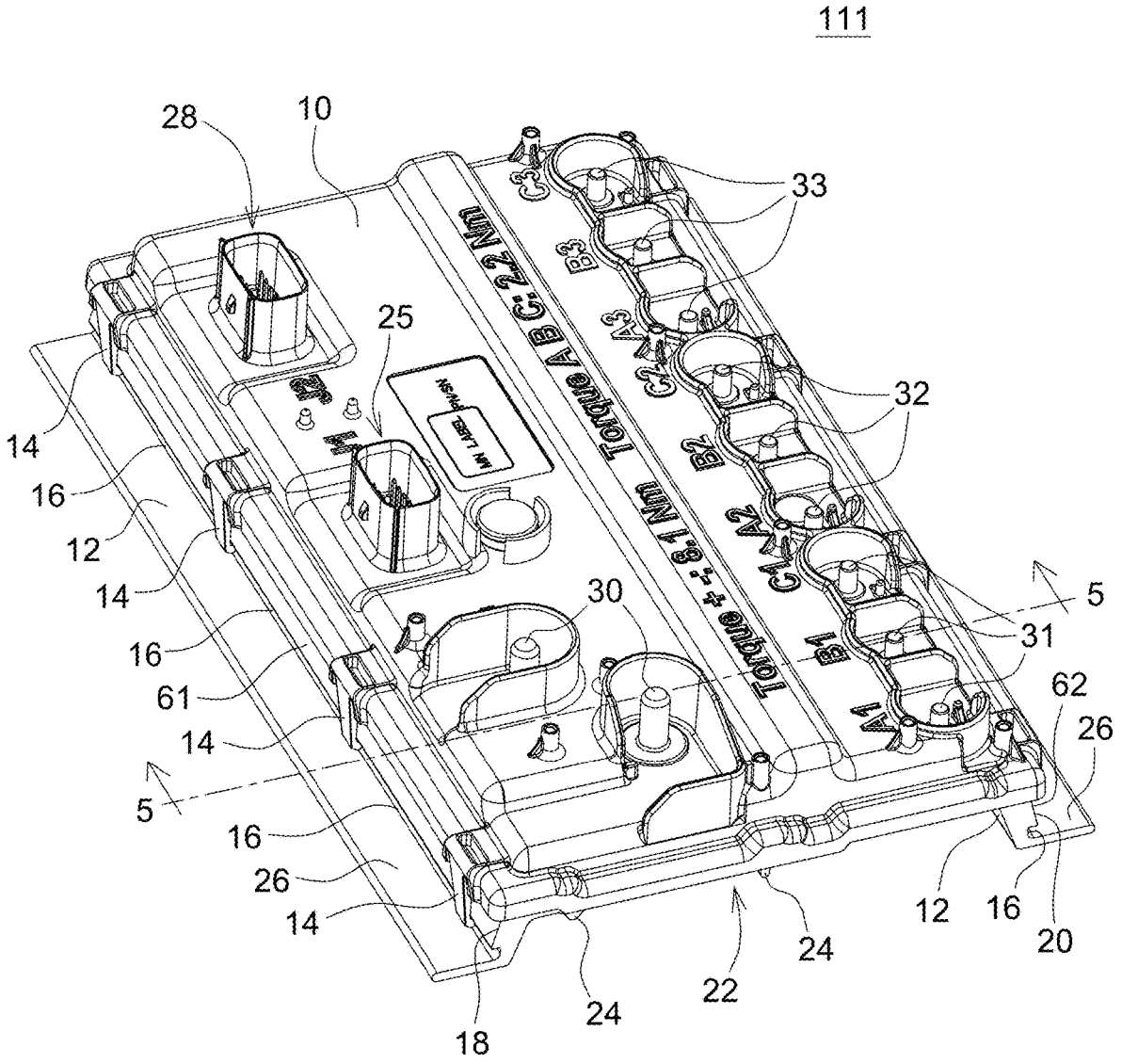
FIG. 1 is a perspective view of an upper side of a first embodiment of an electronic assembly.

In accordance with one embodiment, FIG. 1 illustrates a perspective top view of an electronic assembly 111 that comprises a first housing portion 12 having one or more recesses 16 along at least a portion of an outer perimeter 17 of the first housing portion 12. A second housing portion 10 has one or more arms 14 extending from a body of the second housing portion 10 that terminate in mating protrusions 15. One or more arms 14, or one or more mating protrusions 15, or both, engage the recesses 16 (e.g., grooves) in a snap-fit connection of a snap-fit connector 19 or a mechanical clip.

Figure 2:
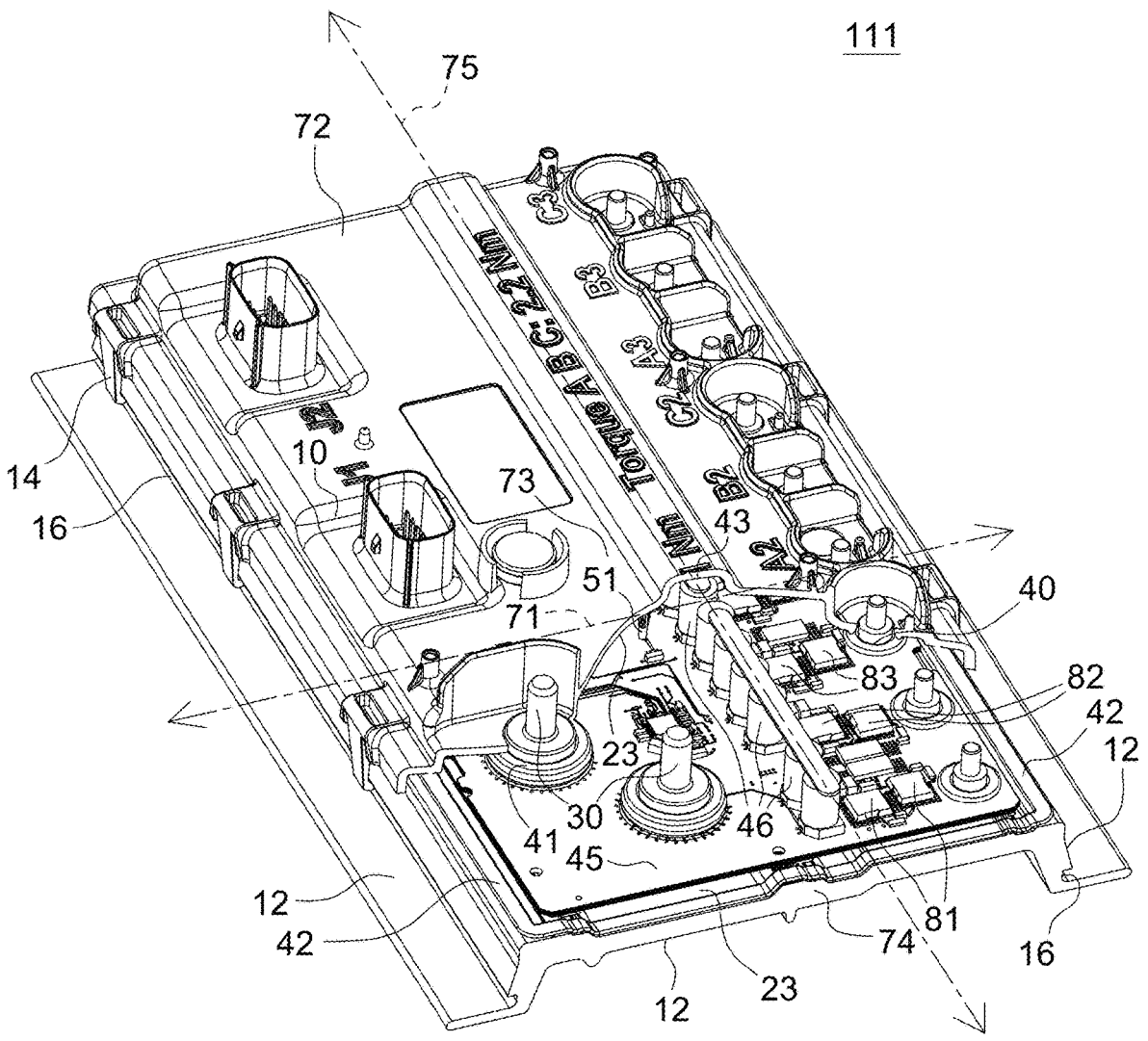
FIG. 2 is a perspective view of an upper side of a first embodiment of the electronic assembly with a portion cut-away.

A cavity 23, such as an interior, is formed between the first housing portion 12 and the second housing portion 10. In FIG. 2, the second housing member 10 is cut away to reveal a circuit board 45 that resides in the cavity 23; as illustrated in the cross-section of FIG. 5, the circuit board 45 has a conductive trace 52 (e.g., metallic pad) that faces the first housing portion 12 at a metallic conductive region 13, wherein the snap-fit connector 19 or mechanical clip forms an electrical and mechanical connection between the conductive trace 52 and the metallic conductive region 13.

In one embodiment, the snap-fit connector 19 comprises a combination of the snap-fit arms 14, mating protrusions 15 and respective recesses 16 to secure or removably connect the first housing portion 12 to the second housing portion 10. Further, the snap-fit connector 19 or its snap-fit arms 14 provide a compressive force or clamping force between the conductive trace 52 and the metallic conductive region 13, while the snap-fit connector 19 securely or removably connects the first housing portion 12 to the second housing portion 10.

In an alternate embodiment, one or more snap-fit connectors 19 may be replaced by a hinged compression clamp, such as a toggle latch clamp, that is mounted on the exterior sides of one housing portion (e.g., 10, 110, 12, 112) to engage a catch or projection on an opposite housing portion of the electronic assembly (111, 211). For example, the hinged compression clamp has a stationary base that is mounted (e.g., fastened) to one housing portion and a stationary catch that is mounted (e.g., fastened) to the opposite housing portion, where the stationary base has a lever that is pivotally or rotatably mounted to the stationary base via first hinge. Meanwhile the lever has a latch or latching member that is pivotally or rotatably mounted to the lever via a second hinge, where the latching member terminates in a hook that can engage the catch to clamp, secure, or lock together the housing portions (e.g., 10 and 12, or 110 and 112) of the electronic assembly (111, 211).

In one embodiment, the first housing portion 12 comprises a metallic base with an exterior surface 22. For example, the first housing portion 12 is formed of extruded metal or an extruded alloy and has set of longitudinal ridges 24 on the exterior surface 22, where the longitudinal ridges 24 can add structural integrity and can promote heat dissipation of heat-generating components. The first housing portion 12 is formed of a extruded metal or an alloy and has a set of longitudinal ridges 24 and a foot 26 portion, where the longitudinal ridges 24 extend along or parallel to longitudinal axis 78.

Alternately, the first housing portion 12 may be cast of metal or an alloy, or molded from plastic, polymer, or composite material with surface metallization to form conductive region (e.g., metallic conductive region 13) that interfaces with the conductive trace 52 (e.g., metallic pad) of the circuit board 45.

In the electronic assembly 111, one or more heat-generating components are mounted on one or both sides of the circuit board 45. For example, heat-generating components comprise capacitors 46, semiconductor switches (81, 82, 83), and other electrical or electronic devices of the electronic assembly 111

The second housing portion 10 comprises a lid, wherein the lid is composed of a plastic, a polymer, or a composite material. For example, for a composite material, the lid may be formed of plastic or polymer matrix with a filler, such as carbon fiber, fiberglass, or the like. In one embodiment, the arms 14 (of the second housing portion 10), or both the arms 14 and the mating protrusions 15, are composed of a somewhat flexible or elastically deformable plastic, a polymer or a composite material to support the snap-fit connector 19.

In one embodiment, the one or more recesses 16 comprises a first groove in a corresponding first exterior side 61 (e.g., first exterior wall 18) of the first housing portion 12 and a second groove in a corresponding second exterior side 62 of the first housing portion 12, where the first exterior side 61 is opposite the second exterior side 62 (e.g., second exterior wall 20).

Figure 5:
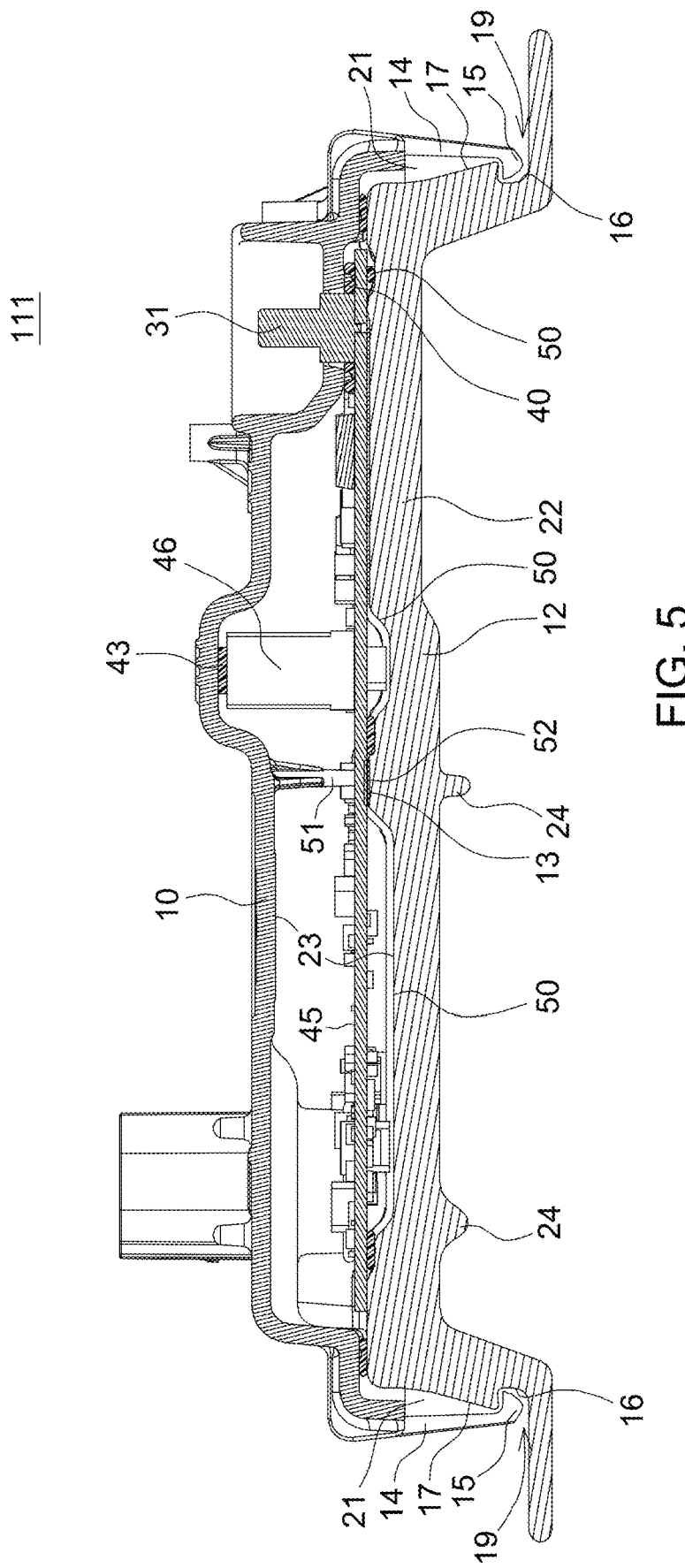
FIG. 5 is a cross-section of a first embodiment of an electronic assembly along reference line 5-5 of FIG. 1.
Figure 6:
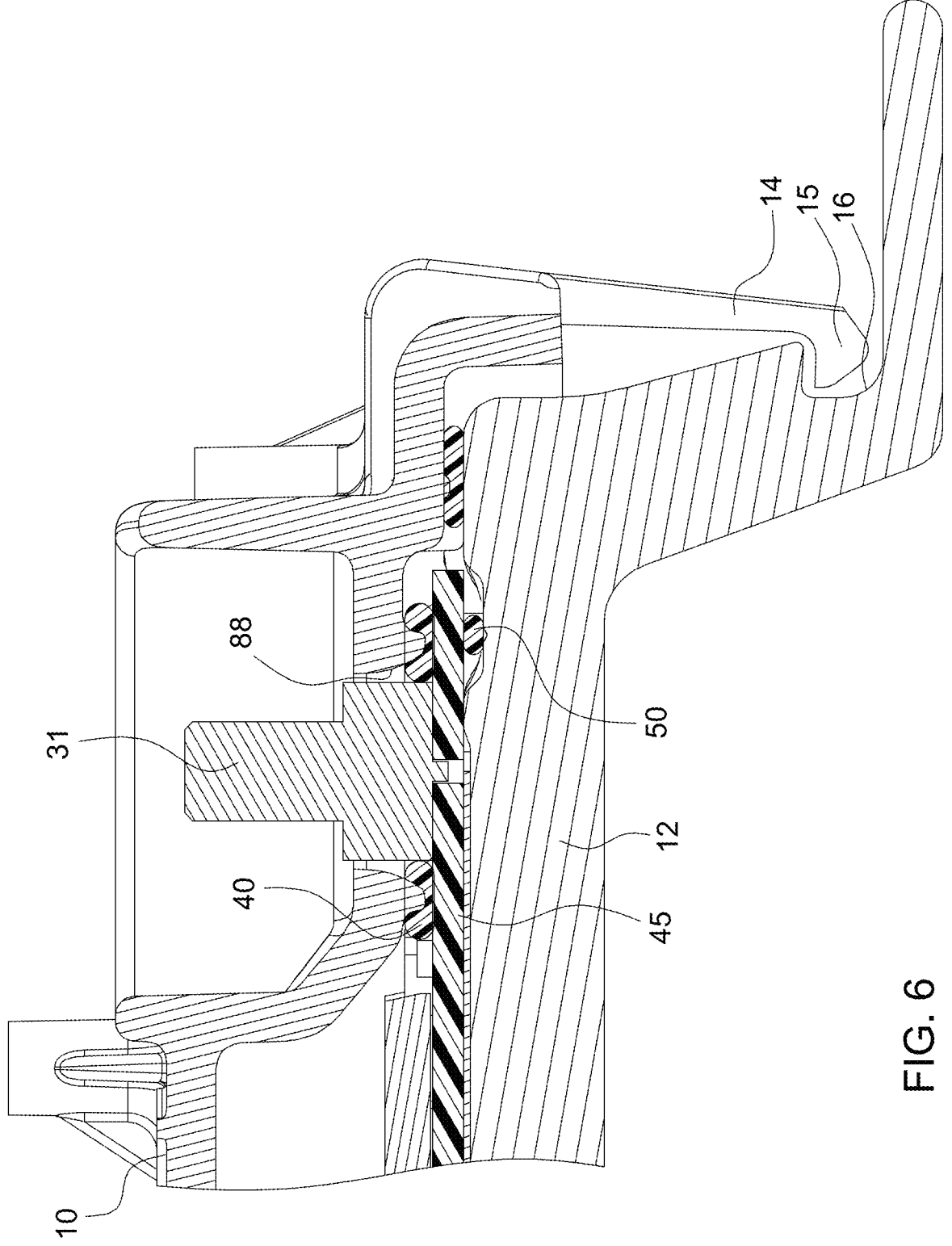
FIG. 6 is an enlarged view of the right side of the cross-section of FIG. 5.
Figure 7:
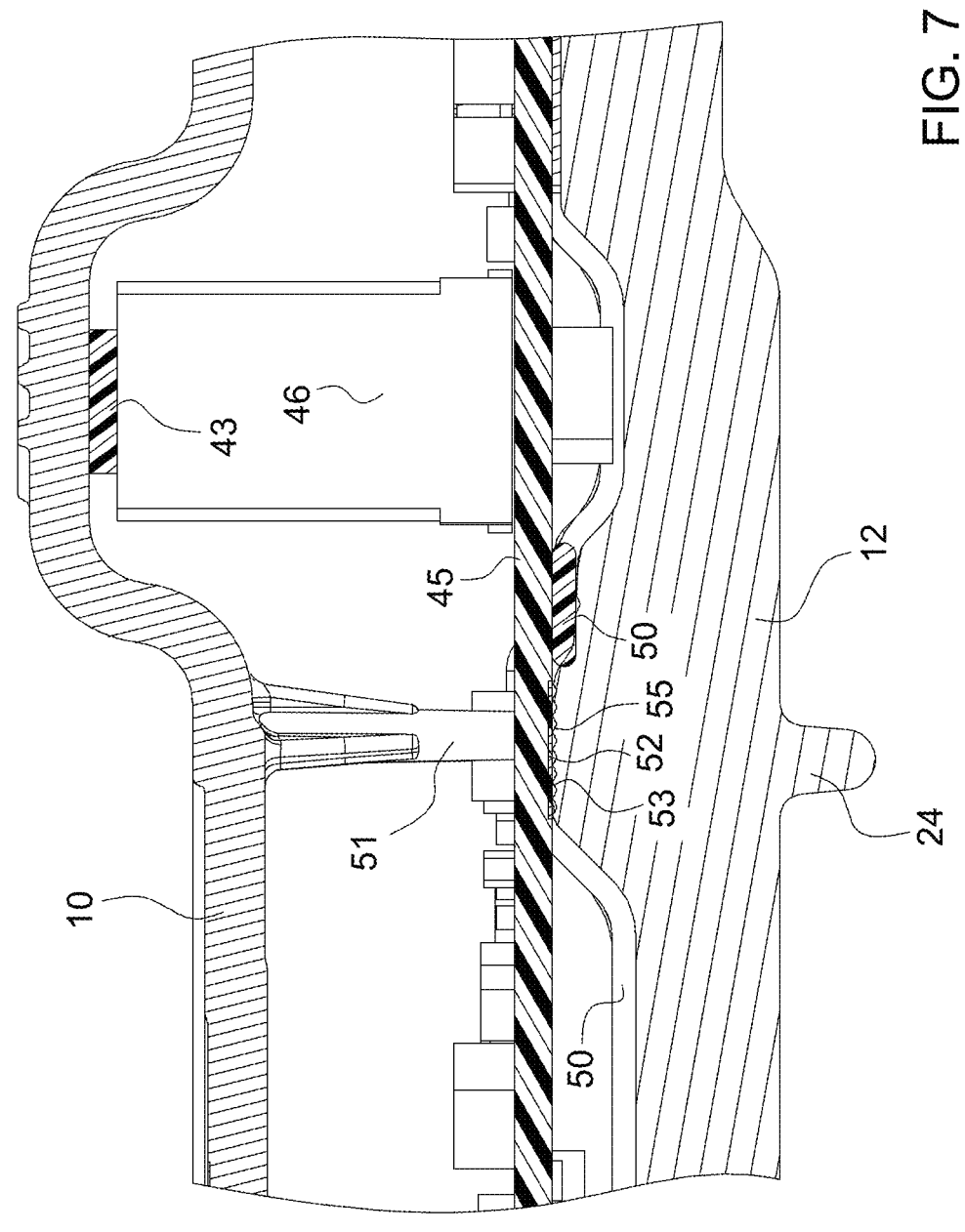
FIG. 7 is an enlarged view a central region of the cross-section of FIG. 5.

Each arm 14 terminates in a protrusion 15 that is of a size and shape to engage or mate with a corresponding recess 16 (e.g., groove or slot) in the second housing portion 10. Each recess 16 (e.g., groove) has a cross-section or profile that is configured to receive the protrusion 15 at the end of the respective arm 14. Further, each arm 14 can elastically deform prior to engaging the corresponding recess 16 (e.g., groove). As shown in FIG. 5, the outer perimeter (surface) 17 of the first housing portion 12 is generally tapered downward and outward such that the elastic deformation of each arm 14 is greatest during assembly and prior to the mating protrusion's engaging or interlocking with the recess 16 (e.g., groove).

Further, the air gap 21 between the outer perimeter (surface) 17 and arm 14 supports removal of the first housing portion 12 from the second housing portion 10 by allowing the end user to insert a tool (e.g., a screwdriver or pry bar) in the air gap to elastically withdraw the protrusion 15 from the recess 16, while elastically, temporarily deforming an arm 14 such that the protrusion 15 can clear the perimeter surface of the first housing portion 12.

Figure 8:
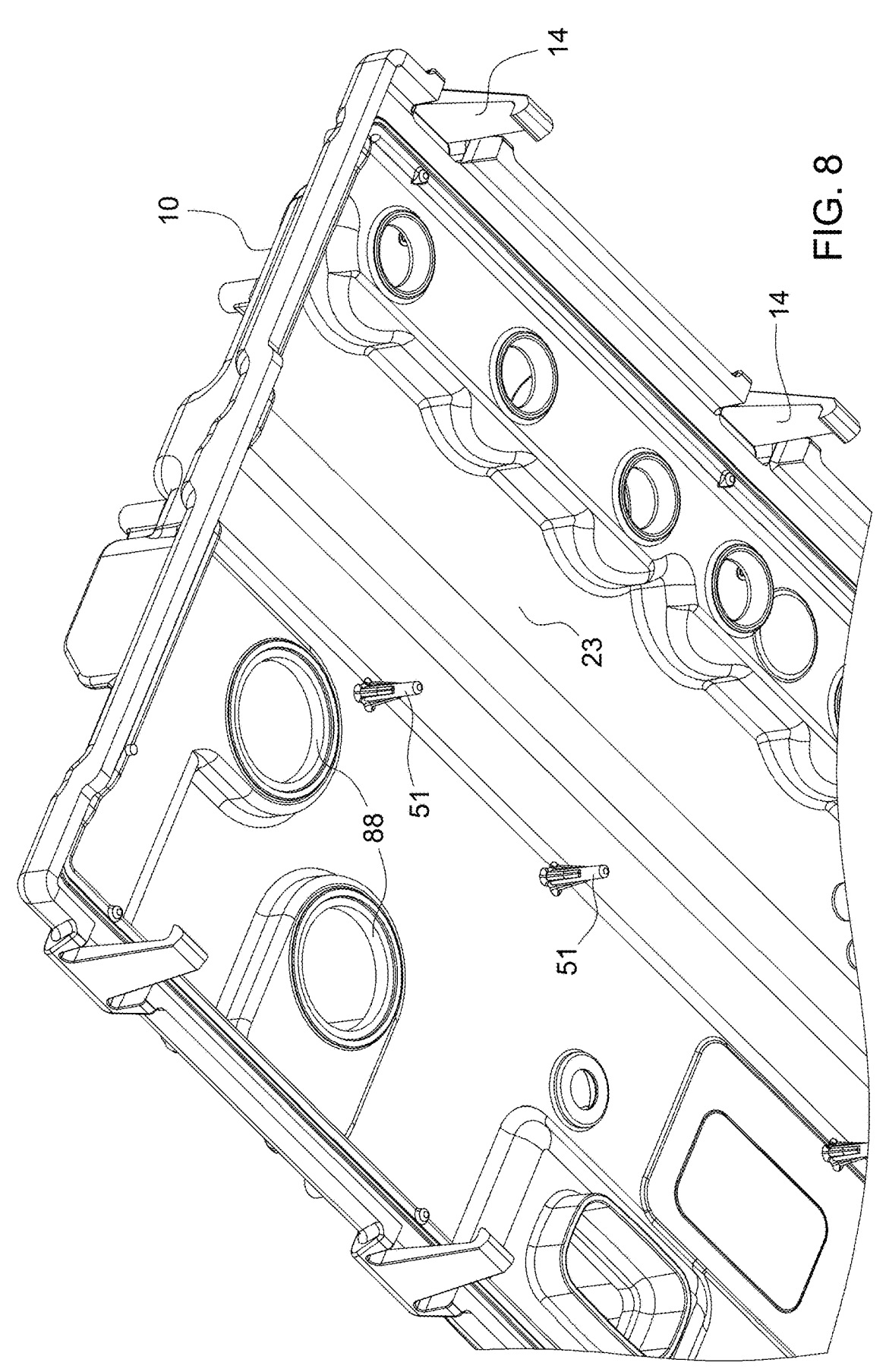
FIG. 8 is a perspective view of the interior of a second housing portion of FIG. 1.

In one embodiment, the second housing portion 10 has a first array of arms 14 that extend (e.g., downward in FIG. 1 and FIG. 8) from the second housing portion 10 to engage one or more respective recesses 16, such as a first groove or first set of grooves that are spaced apart from each other. Meanwhile, the second housing portion 10 has a second set of arms 14 extending (e.g., downward in FIG. 1 and FIG. 8) from the second housing portion 10 to engage one or more recesses 16, such as the second groove, or second set of grooves that are spaced apart from each other. For example, as illustrated in FIG. 1, the recesses 16 in the first housing portion 12 comprise a continuous first groove and a second groove, where each groove has cross section (e.g., upper surface or lip) that can receive the tab, projection, or hook.

In an alternate embodiment, the recesses 16 in the first housing portion 12 may comprise discontinuous set for first grooves and a discontinuous set of second grooves.

The second housing portion 10 has a projection or post 51 that extends (e.g., downward) in the cavity 23 and above the circuit board 45. In one embodiment, the second housing portion 10 has a projection or post 51 that contacts an opposite side of the circuit board 45 opposite the conductive trace 52, and wherein the first housing portion 12 has conductive protrusion (e.g., conductive ridge) associated with the metallic conductive region 13 to contact the conductive trace 52 on the circuit board 45. For example, the conductive protrusion or conductive ridge of the first housing portion 12 may be formed of solder, such as solder that was applied and reflowed prior to assembly of the circuit board 45 within the cavity of the enclosure established by mating the first housing portion 12 with the second housing portion 10. In one embodiment, the post 51 projects downward: (a) to an extent that is greater than a gap or spacing between an lower interior surface of the second housing portion 10 and the top or upper surface of the circuit board 45, (b) to an extent that causes physical interference between the printed circuit board (45, 145) and its upper surface, or both to cause the second housing portion 10 to be preloaded with a biasing force to clamp or compress the conductive trace or conductive pad (opposite the contact point of the post 51) on the circuit board 45 toward the conductive protrusion of the interior of the first housing portion 12 (e.g., when the second housing portion 10 is fully engaged or connected to the first housing portion 10). The arms 14 that terminate in protrusions 15 form a snap-fit connector 19 or clips that allow the center of the second housing portion 10 to be spring-like biased or preloaded along the central axis 75 of the second housing portion 10.

Prior to fastening the first housing portion 12 and the second housing portion 10 via one or more snap-fit connectors 19, the second housing portion 10 comprises a cover or lid that is convex or arched downward toward the first housing portion 12. The second housing portion is configured or designed to apply a compressive or clamping force to the circuit board (45, 145). The compressive or clamping force to the circuit board (45, 145) is applied via the second housing portion 10 to cause potentially the solder to deform. The second housing portion has sufficient strength, flexibility and resilience to maintain contact between the conductive trace of the circuit board 45, the solder and the enclosure of the electronic assembly 111.

In alternative embodiment, which is explained with reference to FIG. 2, prior to connecting the first housing portion 12 and the second housing portion 10 together, the second housing portion 10 may be arched downward (e.g., convexly preloaded with resilient bias) along a transverse axis 71 and above the post 51 near central portion 73 of the second housing portion 10 (e.g., with integral spring-like bias) from which the post 51 extends downwards. For example prior to engagement or locking of the first housing portion 12 to the second housing portion 10 a clearance gap may exist between them at opposite sides (72, 74). However, when or while the second housing portion 10 is fully connected to the first housing portion 12 via the snap-fit connectors 19 the second housing portion 10 is elastically deformed or biased (compressively) such that one or more of the following occurs: (a) the clearance gap disappears, where the mating portions of the second housing portion 10 is generally planar and conforms to the first housing portion 12 (e.g., at sides (72, 74); (b) the second housing portion 10 unfolds about the transverse axis 71 to eliminate any appearance of convexity or the clearance gap, (c) the second housing portion 10 is configured to apply compressive force or clamping force between an opposite side of the circuit board 45 opposite conductive trace 52 and the metallic conductive region 13. The above convexity can be applied to one or more posts 51 near or around the centra portion of the second housing portion 10.

In yet another alternative embodiment, the solder of the metallic conductive region is associated with the solder flow through the circuit board (45, 145) during reflow in an oven to creating a solder icicle on one side (e.g., lower side) of the circuit board (45, 145). For example, the alternative embodiment, would be a design improvement for any circuit board that is manufactured or made through a single-sided reflow.

As illustrated in FIG. 5, the conductive trace 52 on the circuit board 45 and the first housing portion 12 are electrically grounded through the above electrical and mechanical contact between the conductive trace 52 and the metallic conductive region 13 or conductive protrusion associated with the metallic conductive region 13. The conductive ridge comprises a solder bump. The conductive ridge comprises one or more of the following: a generally planar surface, a wavy, stippled, or grooved surface. For example, in one embodiment, the conductive ridge has a wavy surface in which rows of peaks 53 that are separated by intervening valleys 55.

In FIG. 2, first semiconductor switches 81 may comprise a first pair of a low-side semiconductor switch and a high-side semiconductor switch. A second pair of semiconductor switches 82 may comprise a second pair of a low-side semiconductor switch and a high-side semiconductor switch. A third pair of semiconductor switches 83 may comprise a third pair of a low-side semiconductor switch and a high-side semiconductor switch.

Figure 3:
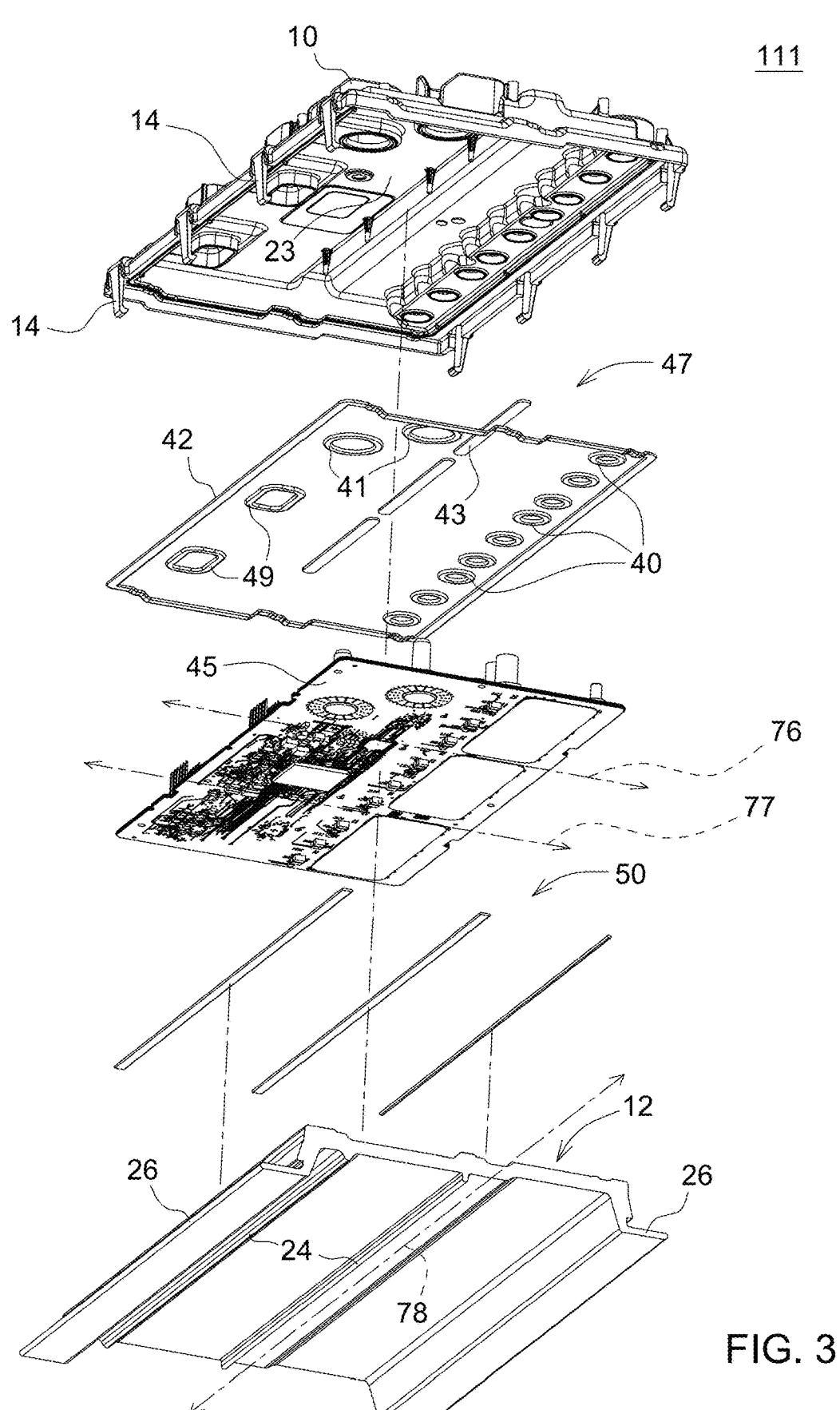
FIG. 3 is an exploded perspective view of a lower side of a first embodiment of the electronic assembly.
Figure 4:
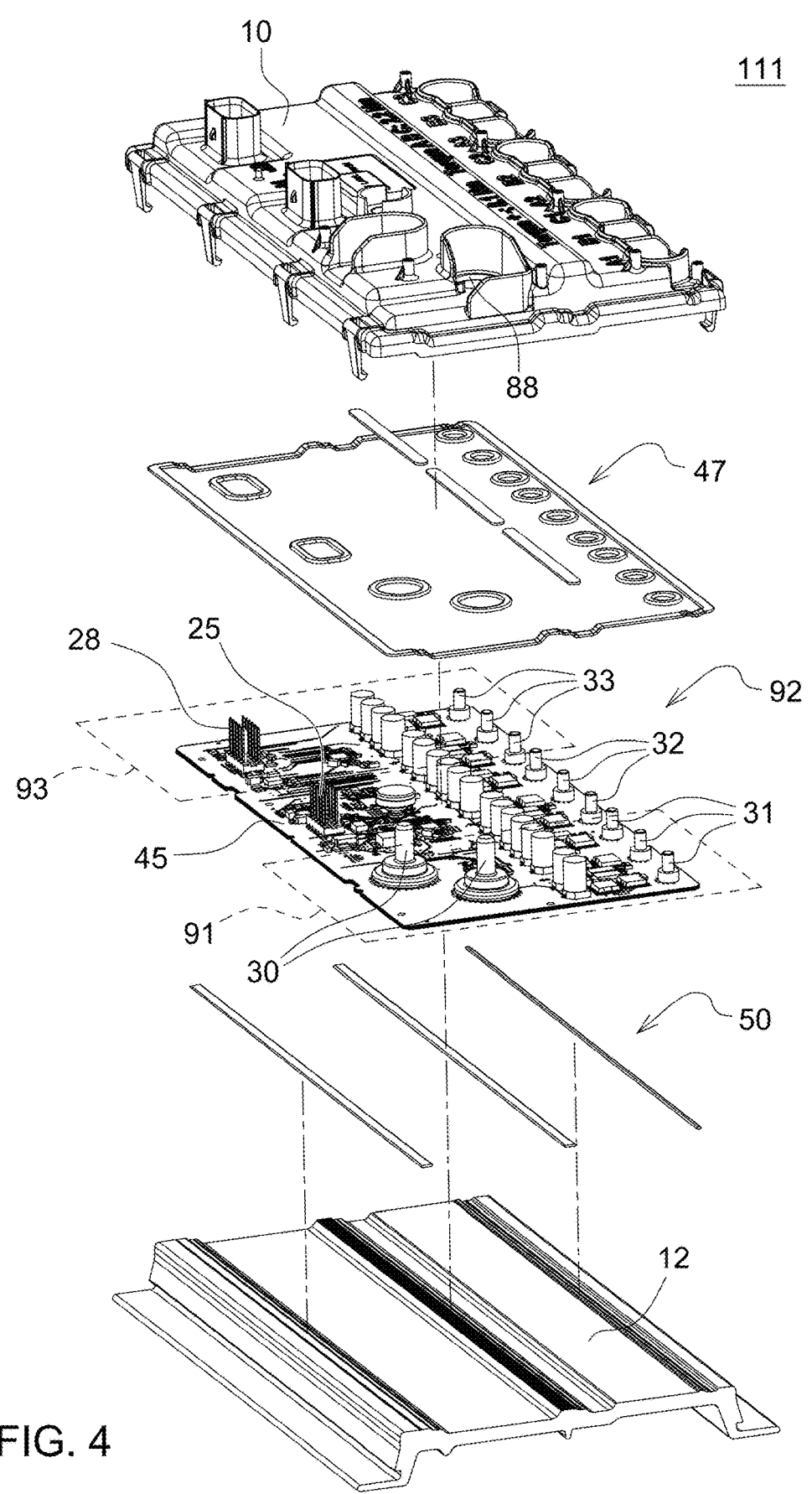
FIG. 4 is an exploded perspective view of an upper side of a first embodiment of the electronic assembly.

As illustrated in FIG. 2, FIG. 3, and FIG. 4, dielectric seals or dielectric sealant is applied, dispensed, placed, or configured for the corresponding target areas of a first volume or first region 47 between the second housing portion 10 and the circuit board 45, and for the corresponding target areas of a second volume or second region 50. In one embodiment, the dielectric seals or dielectric sealant comprises a thermally conductive material, with a thermal conductivity that exceeds a threshold. In one configuration, the dielectric seals or dielectric sealant may comprise an elastomer, a polymeric adhesive, a latex adhesive or another suitable materials that bond to, adhere to, overlie, contact or interface with one or more of the following: the first housing portion 12, the second housing portion 10, the circuit board 45 or heat-generating components associated with the circuit board 45 or the electronic assembly 111. For example, the dielectric seals or dielectric sealant may form a barrier (e.g., by elastic compression of the dielectric seals or sealant by the snap-fit connector 19, fasteners or attachment, alone or in combination with adhesive bonding or adhesion) to the ingress of moisture, salt, fog, contaminants or debris from entering the cavity 23 formed by the first housing portion 12 connected to the second housing portion 10.

As illustrated in FIG. 3, for the first region 47, the dielectric seals or dielectric sealant comprises one or more of the following: one or more first rings 41, one or more second rings 40, a perimeter barrier 42, a connector seal 49, and component thermal interface 43. For the second region 50, the dielectric seals or dielectric sealant comprises a thermal interface, such as a board thermal interface.

In an alternate embodiment, the circuit board 45 may be divisible or separable into portions defined by the boundary lines along axes (76, 77).

In FIG. 4, the circuit board 45 comprises a first power electronics module 91 within a first region of the circuit board 45, a second power electronics module region 92 within a second region of the circuit board 45, and a third power electronics module region 93 within a third region of the circuit board 45. Each of the first power electronics module 91, the second power electronics module 92 and the third power electronics module 93 comprises an electric circuit (e.g., inverter or electric motor controller), wherein each electric circuit has a set of alternating current (AC) terminals (31, 32, 33) that are mounted on the circuit board 45 and that extend through one or more openings 88 in the second housing portion 10. Further, the first power electronics module 91, the second power electronics module 92, and the third power electronics module 93 share a common set of direct current (DC) terminals 30 (e.g., of the third power electronics module 93) on the exterior of the second housing portion 10. The axes (76, 77) define the boundaries between first power electronics module 91, the second power electronics module 92 and the third power electronics module 93.

Figure 9:
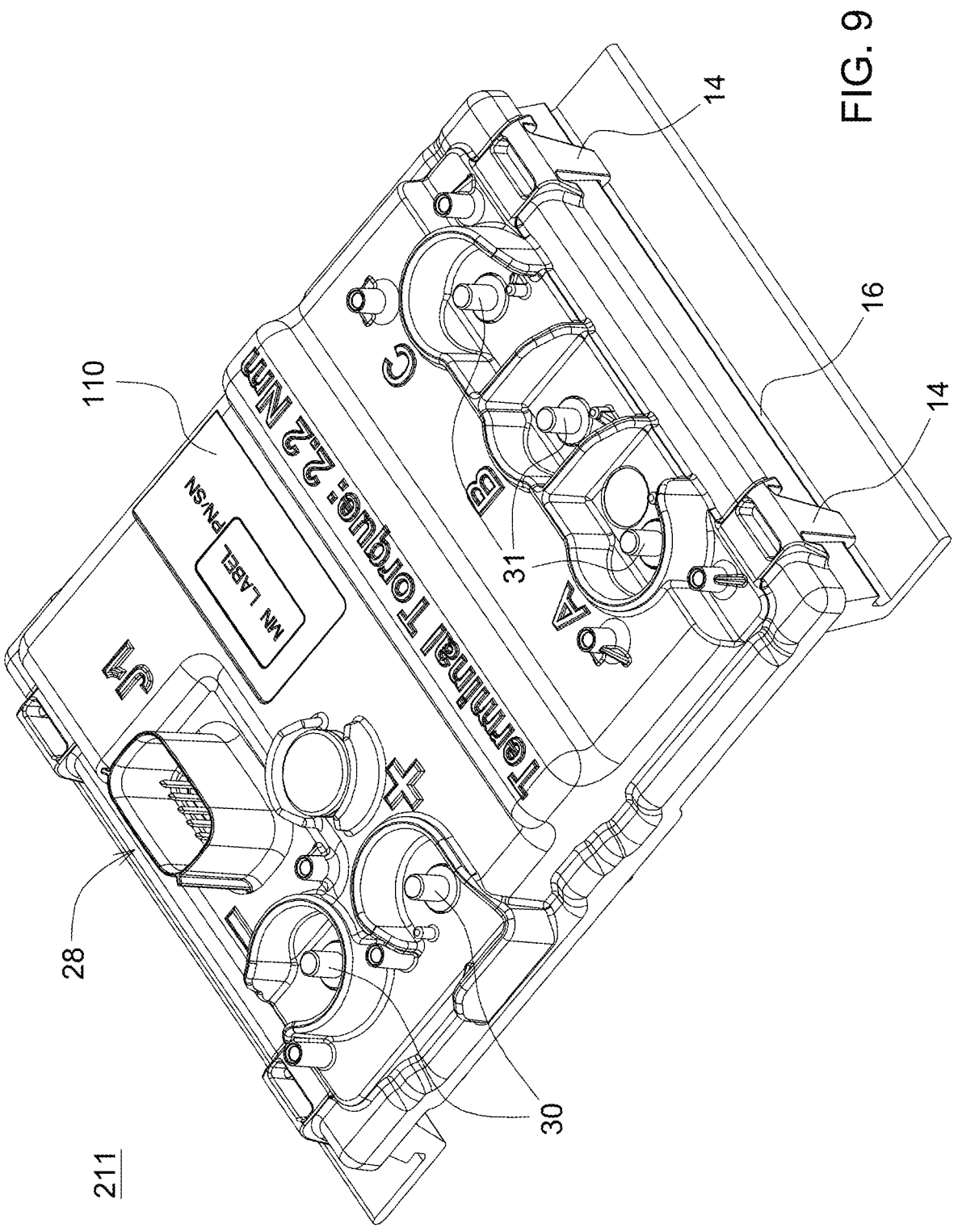
FIG. 9 is a perspective view of an upper side of a second embodiment of the electronic assembly.

FIG. 9 is a perspective view of an upper side of a second embodiment of the electronic assembly 211. The electronic assembly 211 is similar to the electronic assembly 111, except the electronic assembly 211 comprises the first power electronics module 91 (of the respective first region) that is separated from or divided from the second power electronics module 92 of the respective second region and the third power electronics module 93 of the respective third region; hence, the electronic assembly 211 differs from the electronic assembly 111 as follows: (a) the electronic assembly 211 replaces circuit board 45 of the electronic assembly 111 with circuit board 145; (b) circuit board 145 is similar to the first power electronics module 91 of the respective first region of circuit board 45; (c) circuit board 145 is populated with similar electronic components as circuit board 45, such as heat-generating components, capacitors, and semiconductor switches; (d) the circuit board 145 has similar conductive traces and board layout to the first region of circuit board 45; (c) the first housing portion and the second housing portion are reduced in size or volume to house, enclose and protect the circuit board 145 and its electronic components from the ingress of moisture, salt, fog and debris; (f) common design feature or reusable design feature of the circuit board 145 are based on circuit board 45 (e.g., to facilitate efficient manufacturing, design and test of the electronic assembly 211). Like reference numbers in FIG. 1 and FIG. 9 indicate like elements or features.

Figure 10:
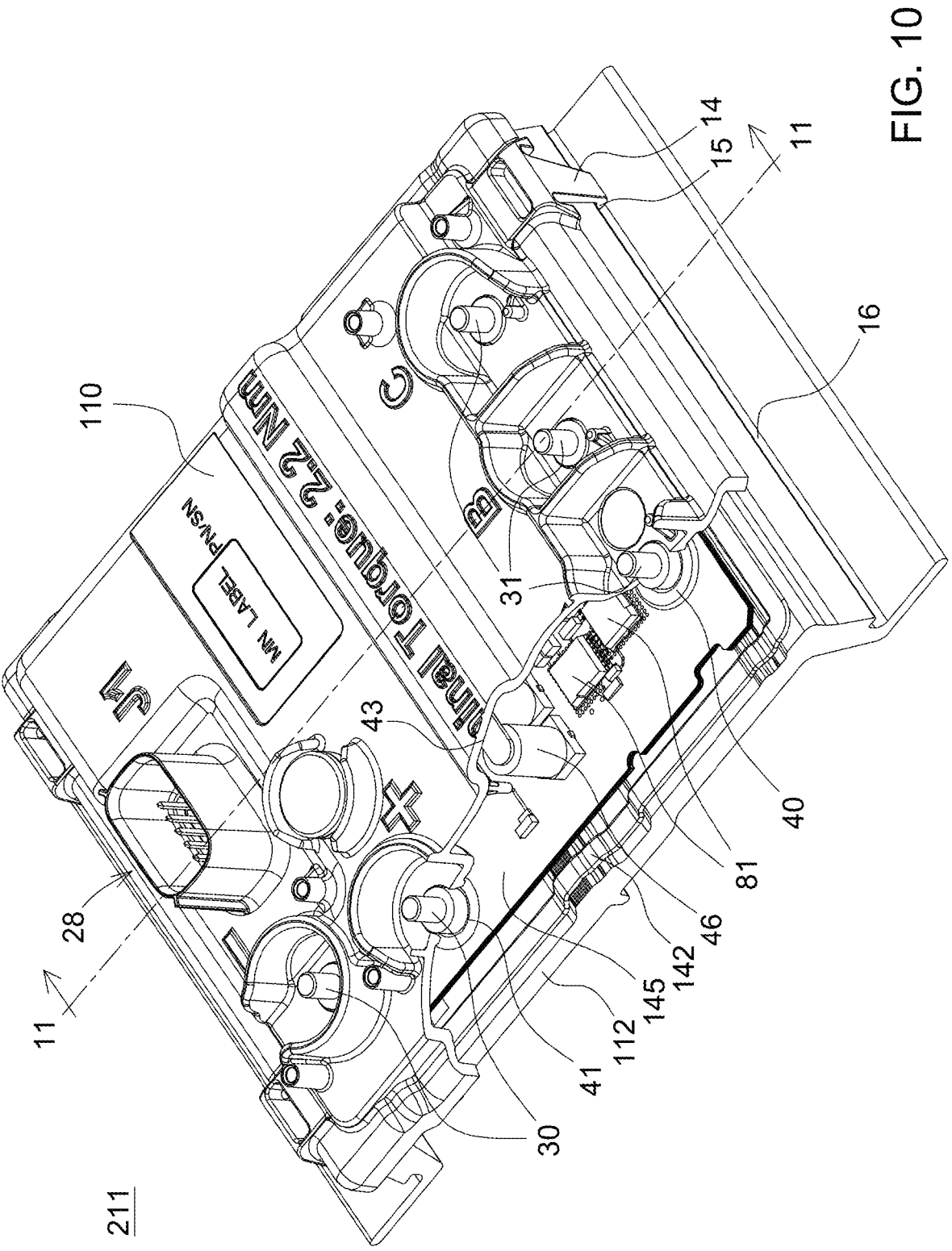
FIG. 10 is a perspective view of an upper side of a second embodiment of the electronic assembly with the electronic assembly cutaway to reveal the circuit board.

As indicated above, the first housing portion 112 of the electronic assembly 211 is similar to the first housing portion 12 of the electronic assembly 111, except the first housing portion is scaled down in size or volume to house the circuit board 145 (e.g., within a reduced cavity). Similarly, the second housing portion 110 for the electronic assembly 111 is similar to the second housing portion 10 of the electronic assembly 111, except the second housing portion is scaled down in size or volume to house the circuit board 145 (e.g., within a reduced cavity). As illustrated in FIG. 10 a perimeter seal 142 or perimeter sealant provides barrier (e.g., water resistant or watertight) and thermal interface (e.g., thermally conductive interface) between the first housing portion 112 and the second housing portion 110 while they are connected to each other. Meanwhile, a thermally conductive interface 150 provides or enhances thermal communication between one or more heat-generating components of the circuit board 145 and the ambient environment via the first housing portion 112.

FIG. 10 is a perspective view of an upper side of a second embodiment of the electronic assembly with the electronic assembly cutaway to reveal the circuit board.

Figure 11:
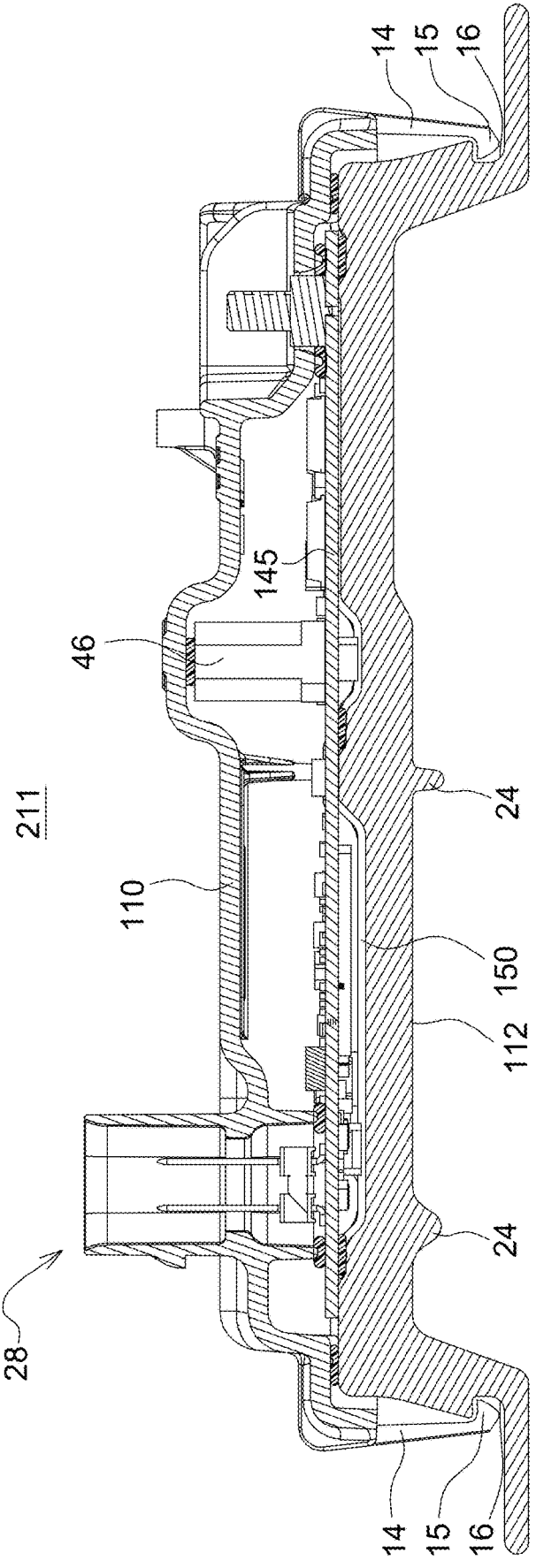
FIG. 11 is a cross-section of a second embodiment of an electronic assembly along reference line 11 of FIG. 10.

FIG. 11 is a cross-section of a second embodiment of an electronic assembly along reference line 11 of FIG. 10.

In one configuration, the first power electronics module region 91 and second power electronics module 92 share common control terminals of connectors 25, wherein the first region of the first power electronics module 91 and the second region of the second power electronics module 92 are adjacent to each other. Further, in one configuration the third region of the third power electronics module 93 is separable, divisible, or capable of removal from the first power electronics module 91; the second power electronics module 92 and the third power electronics module 93 have a separate secondary control terminals of connector 28 from the common control terminals 25. The first power electronics module 91 is illustrated as a separate module in FIG. 9 through 11.

The disclosure is well-suited to reduce or eliminate one or more screws, one or more deflectable spring contacts, and any attendant installation costs, that are otherwise required to create an electrical connection between a conductive trace of the circuit board and a cavity of the enclosure (e.g., at electrical or chassis ground). Instead, an electrical connection is established by securing or joining the first housing portion (12, 112) to the second housing portion (10, 110) via one or more snap-fit connectors 19 or clips, among other features to establish contact between a conductive trace on the circuit board and a corresponding conductive region of the first housing portion (12, 112). For example, the enclosure facilitates the use of an extruded aluminum design for the first housing portion without any grounding screws to connect to electrical ground or chassis ground and without any spring-biased electrical connections to connect to electrical ground or chassis ground.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

The following is claimed:

1. An electronic assembly comprising:
   a first housing portion having one or more recesses along at least a portion of a perimeter of the first housing portion;
   a second housing portion having one or more arms extending from a body of the second housing portion to engage the one or more recesses in a snap-fit connection;

a cavity formed between the first housing portion and the second housing portion; and
   a circuit board residing in the cavity, the circuit board having a conductive trace facing the first housing portion having a metallic conductive region, wherein the snap-fit connection forms an electrical and mechanical connection between the conductive trace and the metallic conductive region, the circuit board including:
      a first power electronics module region;
      a second power electronics module region; and
      a third power electronics module region, each of the first power electronics module region, the second power electronics module region, and the third power electronics module region including an inverter, each inverter including a set of alternating current terminals that are mounted on the circuit board and that extend through the second housing portion, and wherein the first power electronics module region, the second power electronics module region, and the third power electronics module region share a common set of direct current terminals on an exterior of the second housing portion.

2. The electronic assembly according to claim 1 wherein the snap-fit connection provides a compressive force between the conductive trace and the metallic conductive region.

3. The electronic assembly according to claim 1 wherein the first housing portion includes a metallic base.

4. The electronic assembly according to claim 1 wherein the second housing portion includes a lid, the lid composed of a plastic, a polymer or a composite material.

5. The electronic assembly according to claim 1 wherein the second housing portion includes a lid and wherein the one or more arms are composed of a plastic, a polymer or a composite material.

6. The electronic assembly according to claim 1 wherein the first housing portion is formed of extruded metal or an alloy and has set of longitudinal ridges.

7. The electronic assembly according to claim 1 wherein the first housing portion is formed of a extruded metal or an alloy and has a set of longitudinal ridges and a foot portion.

8. The electronic assembly according to claim 1 wherein the one or more recesses include a first groove in a first exterior side of the first housing portion and a second groove in a second exterior side of the first housing portion, where the first exterior side is opposite the second exterior side.

9. The electronic assembly according to claim 8 wherein the one or more arms include (a) a first array of arms extending downward from the second housing portion to engage the first groove and (b) a second array of arms extending downward from the second housing portion to engage the second groove.

10. The electronic assembly according to claim 1 wherein the conductive trace on the circuit board and the first housing portion are electrically grounded through the electrical and mechanical connection.

11. The electronic assembly according to claim 1 wherein the second housing portion has a post that contacts an opposite side of the circuit board opposite the conductive trace, and wherein the first housing portion has conductive ridge associated with the metallic conductive region to contact the conductive trace on the circuit board.

12. The electronic assembly according to claim 11 wherein the conductive ridge includes a solder bump.

13. The electronic assembly according to claim 11 wherein the conductive ridge includes a wavy, stippled, or grooved surface.

14. The electronic assembly according to claim 1 wherein the first and second power electronics module regions share common control terminals and wherein the first and second power electronics module regions are adjacent to each other.

15. The electronic assembly according to claim 14 wherein the third power electronics module region is separable from the first power electronics module region and the second power electronics module region and wherein the third power electronics module region has separate secondary control terminals from the common control terminals.

\* \* \* \* \*